(12) United States Patent
Bryant et al.

(10) Patent No.: US 12,542,554 B2
(45) Date of Patent: Feb. 3, 2026

(54) MODULE WITH SELECTABLE DIGITAL OUTPUTS

(71) Applicant: Siemens Aktiengesellschaft, Munich (DE)

(72) Inventors: William Keith Bryant, Johnson City, TN (US); James Allen Knoop, Flag Pond, TN (US); Michael O'Leary, Johnson City, TN (US)

(73) Assignee: Siemens Aktiengesellschaft, Munich (DE)

( * ) Notice: Subject to any disclaimer, the term of this patent is extended or adjusted under 35 U.S.C. 154(b) by 1 day.

(21) Appl. No.: 18/640,089

(22) Filed: Apr. 19, 2024

(65) Prior Publication Data

US 2025/0330177 A1    Oct. 23, 2025

(51) Int. Cl.
*H03K 19/007*       (2006.01)
*H03K 19/0175*      (2006.01)

(52) U.S. Cl.
CPC ... *H03K 19/017509* (2013.01); *H03K 19/007* (2013.01)

(58) Field of Classification Search
CPC .............. H03K 19/017509; H03K 19/007
USPC ........................................... 327/333
See application file for complete search history.

(56) References Cited

U.S. PATENT DOCUMENTS

| 7,822,896 | B1  |    | 10/2010 | Sagues et al. |
|-----------|-----|----|---------|---------------|
| 10,892,760 | B1 | *  | 1/2021  | Rao ................ H03K 19/017509 |
| 2005/0065618 | A1 |  | 3/2005  | Burkatovsky |
| 2016/0105181 | A1 | * | 4/2016 | Kerr .................. H03K 19/0002 326/59 |

* cited by examiner

*Primary Examiner* — Tomi Skibinski

(57) ABSTRACT

A module includes one or more output channels, wherein each output channel is configured to transmit digital output signals, wherein each output channel comprises switching devices and a load is connectable between the switching devices, and wherein each output channel is individually configurable to operate according to a first output type or a second output type.

11 Claims, 8 Drawing Sheets

MODULE WITH SELECTABLE DIGITAL OUTPUTS

TECHNICAL FIELD

Aspects of the present disclosure generally relate to industrial and other automation systems, and more particularly to a module with selectable digital outputs, for example in connection with an automation system including input/output (I/O) modules.

BACKGROUND ART

Industrial automation systems are used in different industrial fields to automatically perform a plurality of tasks, for example in a manufacturing process or an assembly line of a production facility. Industrial automation systems comprise a plurality of interconnected components, such as for example sensors, actuators, and control devices. The control devices can be for example programmable logic controllers for controlling and monitoring process parameters.

A programmable logic controller (PLC) is used to monitor input signals from a variety of input points (input sensors) which report events and conditions occurring in a controlled process. A control program stored in a memory within the PLC is configured to instruct the PLC what actions to take upon encountering specific input signals or conditions. In response to these input signals, the PLC derives and generates output signals which are transmitted via PLC output points to various output devices, such as actuators and relays, to control the process.

The input points and output points referred to above are typically associated with input modules and output modules, respectively. Input modules and output modules are collectively referred to as I/O modules herein. Those skilled in the art may also refer to I/O modules as I/O cards or I/O boards. The I/O modules are typically pluggable into respective slots located on a backplane board of the PLC or provided as distributed I/O connected through a network interface.

Standard I/O modules do not perform safety functions. Safety functions are executed by designated safety modules or safety relays configured to bring a whole system to a safe state. In contrast, fail-safe I/O modules perform safety functions, for example enter a safe state immediately when an error occurs or remain in a safe mode. Fail-safe systems or components are used wherever maximum safety must be guaranteed for people, machine or the environment, and accidents and damage resulting from a fault must be avoided.

SUMMARY

Briefly described, aspects of the present disclosure relate to industrial and other automation systems, and more particularly to a module with selectable digital outputs, for example in connection with an automation system including input/output (I/O) modules.

More specifically, a first aspect of the present disclosure provides a module with a digital output, comprising one or more output channels, wherein each output channel is configured to transmit digital output signals, wherein each output channel comprises switching devices and a load is connectable between the switching devices, and wherein each output channel is individually configurable to operate according to a first output type or a second output type.

A second aspect of the present disclosure provides a control system comprising a central processing unit, a plurality of input/output (I/O) modules, wherein at least one fail-safe module comprises a digital output and one or more output channels, wherein each output channel is configured to transmit digital output signals, wherein each output channel comprises switching devices and a load is connectable between the switching devices, and wherein each output channel is individually configurable to operate according to a first output type or a second output type.

DETAILED DESCRIPTION

To facilitate an understanding of embodiments, principles, and features of the present disclosure, they are explained hereinafter with reference to implementation in illustrative embodiments. They are described in the context of a module with selectable digital outputs.

The components and materials described hereinafter as making up the various embodiments are intended to be illustrative and not restrictive. Many suitable components and materials that would perform the same or a similar function as the materials described herein are intended to be embraced within the scope of embodiments of the present disclosure. Like reference symbols in the various drawings indicate like elements.

Figure 1:
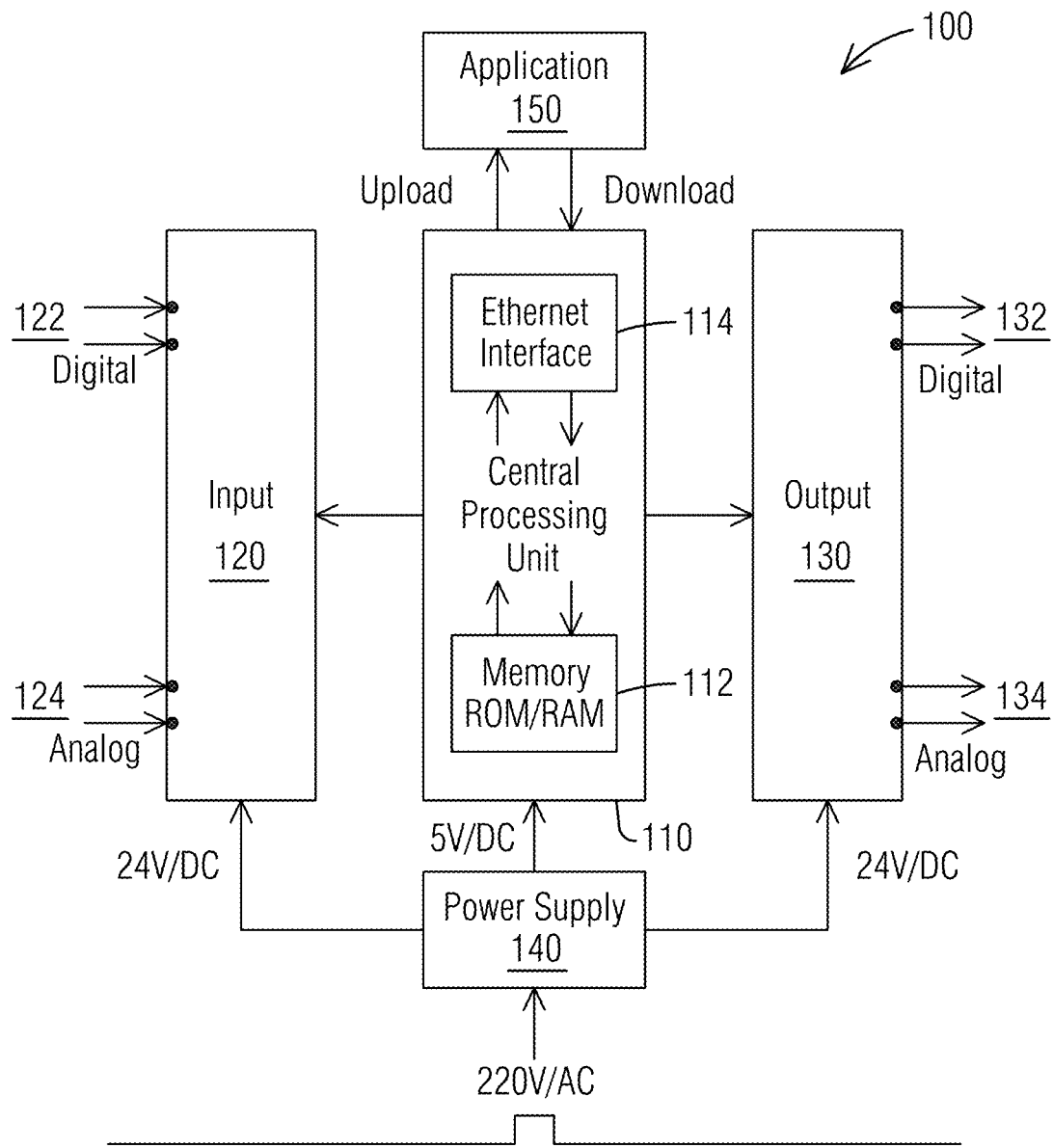
FIG. 1 illustrates a schematic diagram of a known control system in accordance with an exemplary embodiment of the present disclosure.

FIG. 1 illustrates a schematic diagram of a known control system 100 comprising multiple I/O channels in accordance with an exemplary embodiment of the present disclosure.

In an exemplary embodiment, the control system 100 can be configured and/or comprises one or more programmable logic controllers (PLCs), which can comprise multiple modules. As noted, PLCs are typically used in combination with automation systems in different industrial fields to automatically perform a plurality of tasks, for example in a manufacturing process or an assembly line of a production facility. PLCs are control devices for controlling and monitoring process parameters.

The control system 100 comprises a central processing unit (CPU) 110, an input 120 comprising digital and/or analog input channels 122, 124, an output 130 comprising digital and/or analog output channels 132, 134 and a power supply 140 which supplies power, specifically direct current (DC) power, to the CPU 110, the input 120 and the output 130. The input and output 120, 130 typically operate with 24 volts (V) direct current (DC) and the CPU 110 typically operates with 3.3V DC. The CPU 120 can further comprise one or more memories (ROM and/or RAM) 112 and one or more Ethernet interface(s) 114. The input and output 120, 130 are collectively referred to as I/O modules herein. It is noted that the control system 100 as described in connection with FIG. 1 is only one example of a control system, e.g. PLC, wherein such a control system 100 may comprise many other types and/or variations of components or connections. For example, such control systems may be operated, instead of 24V, with 12V, 60V, 120 VAC or 230 VAC. Further, the control system 100 may comprise a CAN BUS interface (instead of Ethernet interface), etc.

The CPU 110 monitors input signals from the input channels 122, 124, such as input sensors, which report events and conditions occurring in a controlled process. An application 150, herein also referred to as control program, is downloaded and stored within the CPU 110 and comprises instructions what actions to take upon encountering specific input signals or conditions. In response to the input signals, the CPU 110 derives and generates output signals which are transmitted via the output channels 132, 134 to various output devices, such as actuators and relays.

The CPU 110, input 120, and output 130 can be standard components or can be fail-safe components (units). Fail-safe behavior of a functional unit means that the unit transitions to a pre-defined safe state if it is no longer able to perform its intended function.

Further components of the control system 100 may include operator terminals which provide interfaces to the control system for monitoring, controlling, and displaying information to an operator or end user. Operator terminals are also known as Human-Machine-Interface (HMI) devices which allow effective operation and control of the components and devices of the automation system from the human end, i. e. the operator or end user, while the components/devices of the automation system feed information back to the operator/end user. It should be noted that those skilled in the art are familiar with such control system and PLCs.

Figure 2:
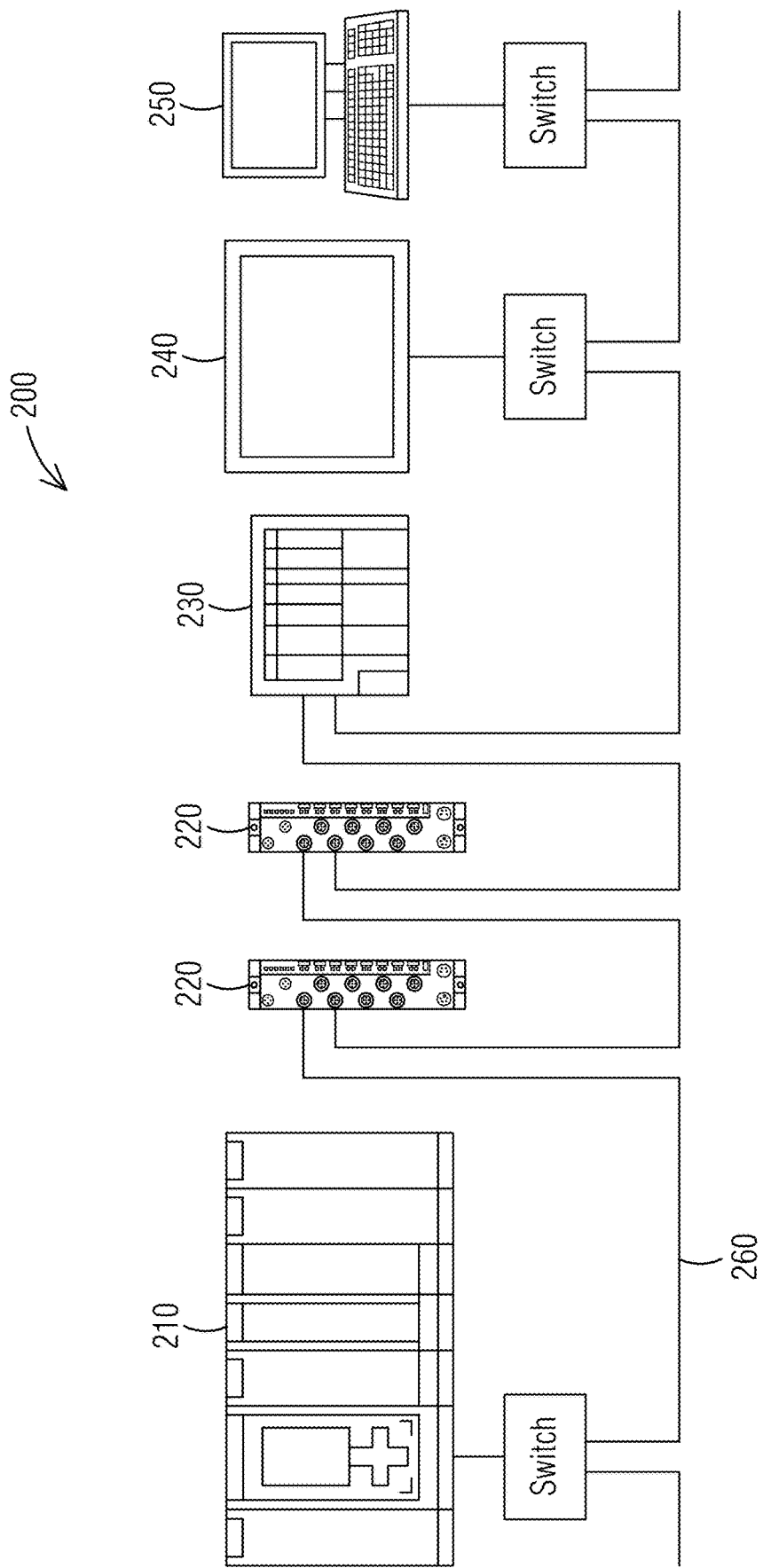
FIG. 2 illustrates a schematic diagram of a known distributed control system with distributed I/O modules in accordance with an exemplary embodiment of the present disclosure.

FIG. 2 illustrates a schematic diagram of a known control system 200 with distributed I/O modules in accordance with an exemplary embodiment of the present disclosure.

A plant configuration often features multiple I/O components within a central automation system. Wiring of I/O components installed at a distance away from an automation system may soon become highly complex and susceptible to electromagnetic interference. Distributed I/O systems provide a solution for such configurations, because they include field devices with a wide range of I/O options, and the field devices (inputs and outputs) are operated locally in a distributed configuration. These field devices can include digital and analog channels, temperature measurements, counter inputs etc.

The control system 200 comprises multiple distributed modules and components which together form the distributed system 200. The components include controller 210, multiple different I/O devices 220, 230, including analog and/or digital inputs/outputs, a human-machine-interface (HMI) device 240 and programming interface 250. The components are operably coupled via industrial ethernet 260, or other suitable communication networks, which ensures communication between sensors, actuators, and the I/O modules and components of the system 200. It should be noted that FIG. 2 illustrates a simplistic view of distributed control system 200, and further details will not be explained herein because one of ordinary skill in the art is familiar with such a control system 200. It is noted that the control system 200 described with reference to FIG. 2 is only one example, wherein such a control system 200 may comprise other and/or different modules, and/or other types and/or variations of components or connections.

The multiple modules and components can be standard components or can be fail-safe components (units). Fail-safe behavior of a functional unit means that the unit transitions to a pre-defined safe state if it is no longer able to perform its intended function.

Figure 3:
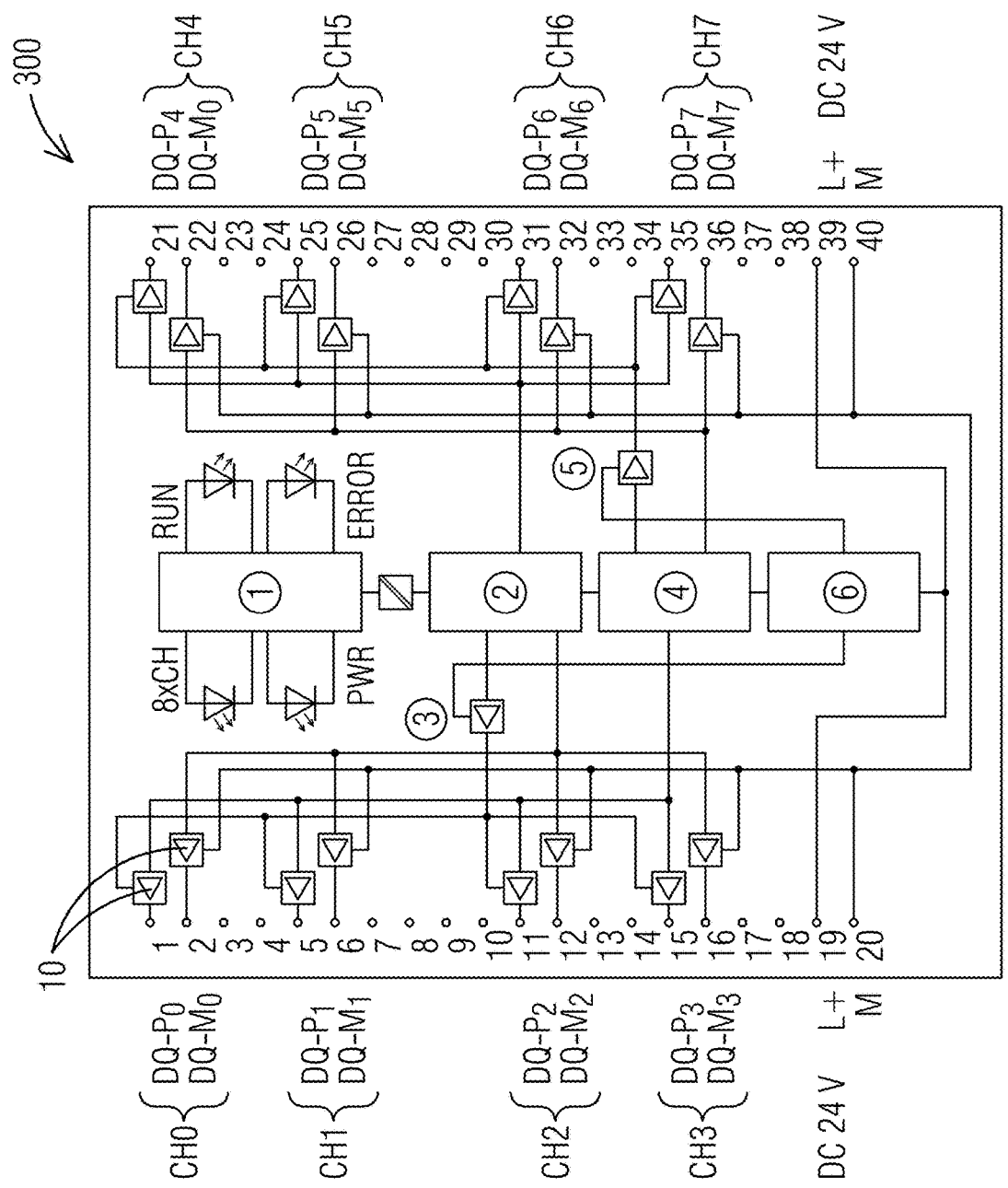
FIG. 3 illustrates a block diagram of a module in accordance with an exemplary embodiment of the present disclosure.

FIG. 3 illustrates a block diagram of a module 300 in accordance with an exemplary embodiment of the present disclosure.

The module 300 provides fail-safe digital outputs, wherein the module 300 comprises at least one digital output. In examples, the module 300 may comprise one output, two outputs, four outputs or eight outputs. Generally, the module 300 may comprise any number of digital outputs. In an example, the output(s) are fail-safe digital output(s), herein also referred to as output channels. Fail-safe digital output refers to a transfer of safety related output data to physical outputs of fail-safe output channels. The digital output module 300 comprises a plurality of fail-safe output channels CH. In an exemplary example, the module 300 has eight (8) digital output channels CH0, CH1, CH2, CH3, CH4, CH5, CH6 and CH7. Each output channel CH is configured to transmit digital output signals. The output signals with output states are passed from a CPU (see for example FIG. 1) to the output module 300, for example via PROFIsafe protocol. In another example, the module 300 may have less than eight (8), for example four (4) distinct fail-safe output channels.

Each channel CH has two (2) outputs DQ-Pn and DQ-Mn ("DQ" referring to Digital Output). This means that each channel CH includes a power connection output (DQ-Pn) and a ground connection output (DQ-Mn).

The module 300 further comprises backplane bus interface 1, microcontrollers 2 and 4, and reverse polarity protection 6. L+ designates supply voltage of 24V DC, and M designates chassis ground.

Each output channel CH0, CH1, CH2, CH3, CH4, CH5, CH6 and CH7 comprises switching devices, wherein a load is connectable between the switching devices. The module 300 can drive resistive, capacitive, and inductive loads. More specifically, each output channel CH0, CH1, CH2, CH3, CH4, CH5, CH6, CH7 employs three separately controlled switching devices that are distinctly operated and diagnosed to achieve a specific output operation type. Each channel CH has assigned switching devices 10. Further, switching device 3 (P1-switch) is assigned to channels CH0, CH1, CH2 and CH3, and switching device 5 (P1-switch) is assigned to channels CH4, CH5, CH6 and CH7.

The fail-safe digital output channels are typically wired as a "P-M" type connection. This means that the actuator (load) being controlled is wired between both power (Pn) and ground (Mn) connections provided from the module's safety output. This is typically the preferred method. Since there are two connections to the output module 300, either connection can turn off the actuator. The fail-safe digital outputs can also be wired as a "P-P" type connection. This means that the actuator being controlled, i.e., the "load", is provided power by a connection from the module's safety output (Pn). However, the ground connection (Mn) is external to the module.

This means that only the power connection can be controlled from the module, which makes the "load" more susceptible to short-related faults. Some output modules combine P-M and P-P style outputs into a single module; however, selection of which style of output to use can only be selected at a module granular level. This means that all output channels CH are either wired per P-M style or per P-P style, but not a mixture.

In accordance with an exemplary embodiment of the present disclosure, at least one output channel CH of the module 300 is individually configurable such that the output channel operates according to a first output type or a second output type. Thus, the output module 300 combines P-M and P-P style output capabilities at a channel granular level. This means that the channel CH can individually be configured as P-M output or P-P output. The output types and wiring will be described with reference to FIG. 4, FIG. 5, FIG. 6, FIG. 7 and FIG. 8. In an example, the module 300 comprises four (4) distinct PPM outputs. Generally, the module 300 comprises at least one output channel configured as PPM output, which means that the channel can operated as P-M output, or as P-P output.

Figure 4:
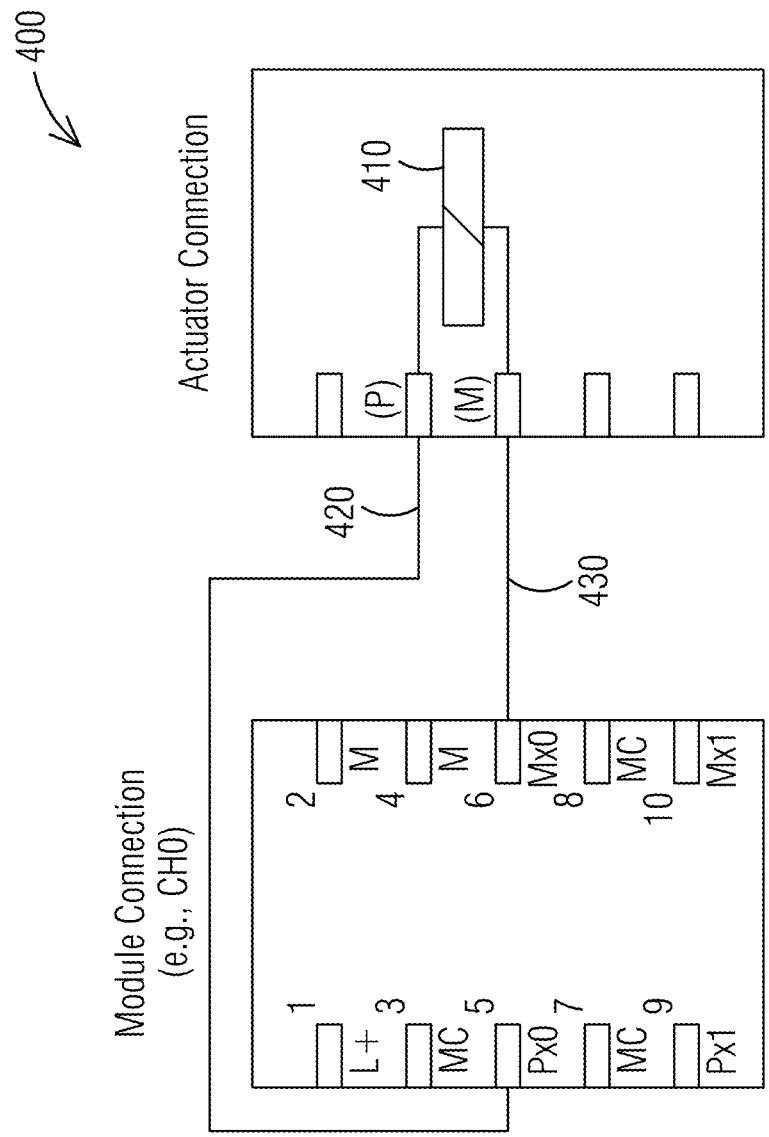
FIG. 4 illustrates a schematic diagram of module wired according to a first output type in accordance with an exemplary embodiment of the present disclosure.

FIG. 4 illustrates a schematic diagram of a module wired according to a first output type 400 in accordance with an exemplary embodiment of the present disclosure.

The first output type 400 is configured as P-M output type, wherein a load 410 is wired between a power connection (P) 420 and a ground connection (M) 430 of the digital output module 300. Direct connection of the load 410 between the P and M outputs of one channel are supported. Internally, a digital P-M channel consists of one P-switch and one M-switch, connected in parallel. Both switches shall be closed to energize the load 410. Both switches shall be opened to de-energize the load 410. Additionally, test pulses of defined maximum duration temporarily open one or the other P or M switches. This configuration achieves SIL 3/Category 4/PL-e. "SIL" refers to safety integrity level (international standard IEC 61508), and "PL" is performance level (standard ISO 13849).

Figure 5:
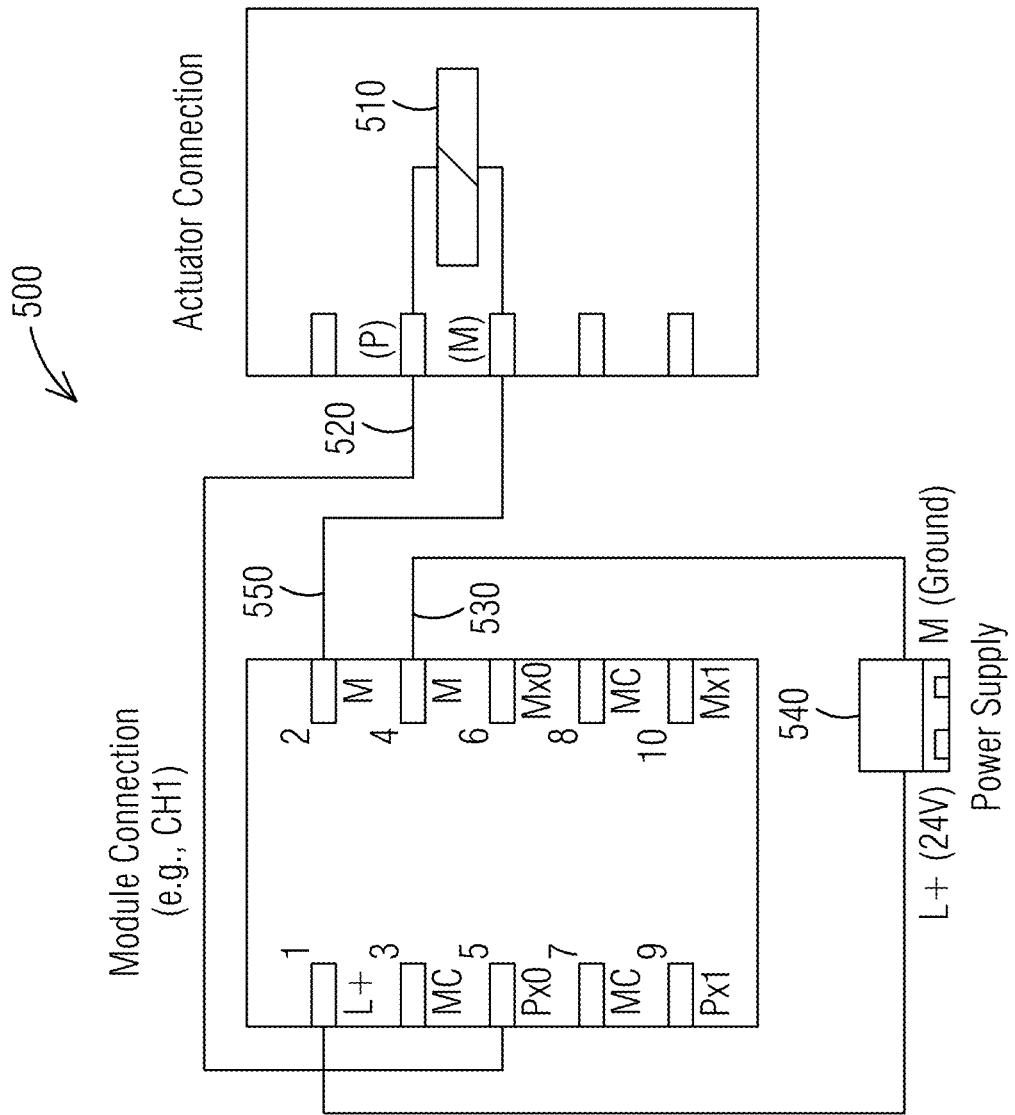
FIG. 5 illustrates a schematic diagram of a module wired according to a second output type in accordance with an exemplary embodiment of the present disclosure.

FIG. 5 illustrates a schematic diagram of a module wired according to a second output type 500 in accordance with an exemplary embodiment of the present disclosure.

The second output type 500 is configured as P-P output type, wherein the load 510 is wired between a power connection (P) 520 of the digital output module and an external ground connection (M) 530. The ground connection 530 is provided for example by an external power supply 540.

Direct connection of the load 510 to only the P-output of one channel is supported (connection 520). Internally, a digital P-P output channel, which can be for example CH1, contains two P-switches, connected in series. Both switches are closed to energize the load 510. Both switches are opened to de-energize the load 510. Additionally, test pulses of defined maximum duration temporarily open one or the other redundant P-switches.

Further, there is additional wiring connection 550 of the load 510 back to the module's M terminal. The purpose of this additional connection is for potential fault mitigation. Without the additional connection 550 and with a disruption to the first M (ground) connection 530, the module may be left in a floating condition (no reference to ground). As a result of this disruption, it is possible that the actuator (load 510) could be energized by current that may flow thru the module from L+ to Px.0 (current greater than the off-state leakage current). Therefore, the additional connection 550 from the load to the module's M terminal is required in order to achieve safety ratings for SIL 3/Category 4/PL-e.

Figure 6:
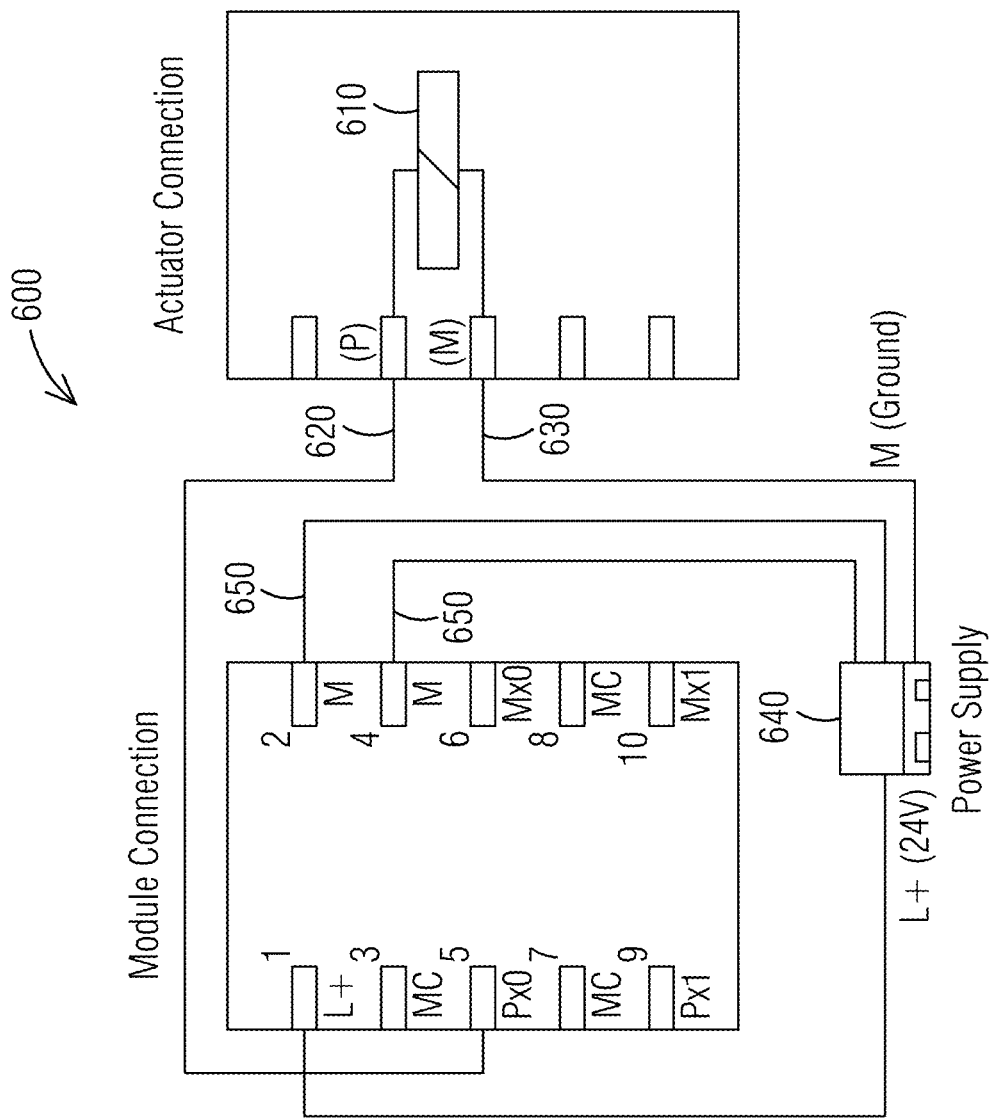
FIG. 6 illustrates a schematic diagram of a module wired according to the second output type in an alternative in accordance with an exemplary embodiment of the present disclosure.

FIG. 6 illustrates a schematic diagram of a module wired according to the second output type in an alternative 600 in accordance with an exemplary embodiment of the present disclosure.

The alternative second output type 600 is configured as P-P output type, wherein the load 610 is wired between a power connection (P) 620 of the digital output module and an external ground connection (M) 630. The ground connection 630 is provided for example by an external power supply 640. Direct connection 620 of the load 610 to only the P-output of one channel is supported. Internally, the digital PP channel contains two P-switches, connected in series. Both switches are closed to energize the load 610 and opened to de-energize the load 610. Additionally, test pulses of defined maximum duration temporarily open one or the other redundant P-switches.

As illustrated in FIG. 6, the load 610 is wired to the ground (M) of the power supply 640 (connection 630). If the load 610 is wired to the ground of the power supply 640, redundant connections 650 are required from the power supply 640 return to the module's M terminals. The purpose of these additional connections 650 is for potential fault mitigation. Without the additional connections 650, ground disruptions could result in the module being left in a floating condition (no reference to ground). As a result, it is possible that the actuator (load 610) could be energized by current that could flow thru the module from L+ to Px.0 (current greater than the off-state leakage current). Redundant connections 650 are required to the module's M terminals to achieve safety ratings for SIL 3/Category 4/PL-e.

Figure 7:
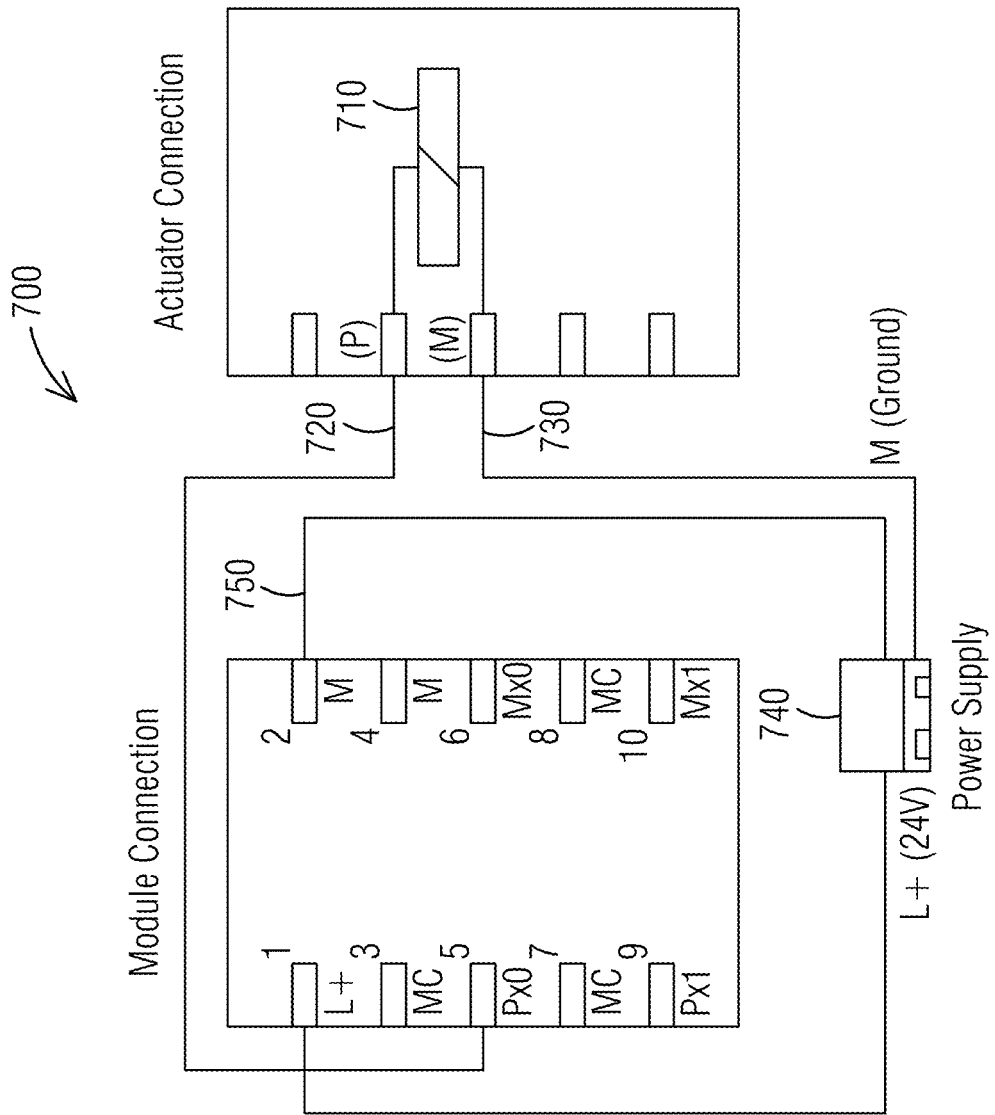
FIG. 7 illustrates a schematic diagram of a module wired according to the second output type in an alternative in accordance with an exemplary embodiment of the present disclosure.

FIG. 7 illustrates a schematic diagram of a module wired according to the second output type in another alternative 700 in accordance with an exemplary embodiment of the present disclosure.

The alternative second output type 700 is configured as P-P output type, wherein the load 710 is wired between a power connection (P) 720 of the digital output module and an external ground connection (M) 730. The ground connection 730 is provided for example by an external power supply 740. Direct connection of the load 710 to only the P-output of one channel is supported. Internally, a digital PP channel contains two P-switches, connected in series. Both switches are closed to energize the load 710 and are opened to de-energize the load 710. Additionally, test pulses of defined maximum duration temporarily open one or the other redundant P-switches.

If a disruption were to occur with the ground (M) connected from the power supply 740 to the module's M terminal, the module could be left in a floating condition (no reference to ground). As a result of this disruption, it is possible that the actuator (load 710) may be energized by current that could flow thru the module from L+ to Px.0 (current greater than the off-state leakage current). Therefore, since there is no redundant ground, this configuration can achieve only a SIL 3/Category 3/PL-d safety rating.

Figure 8:
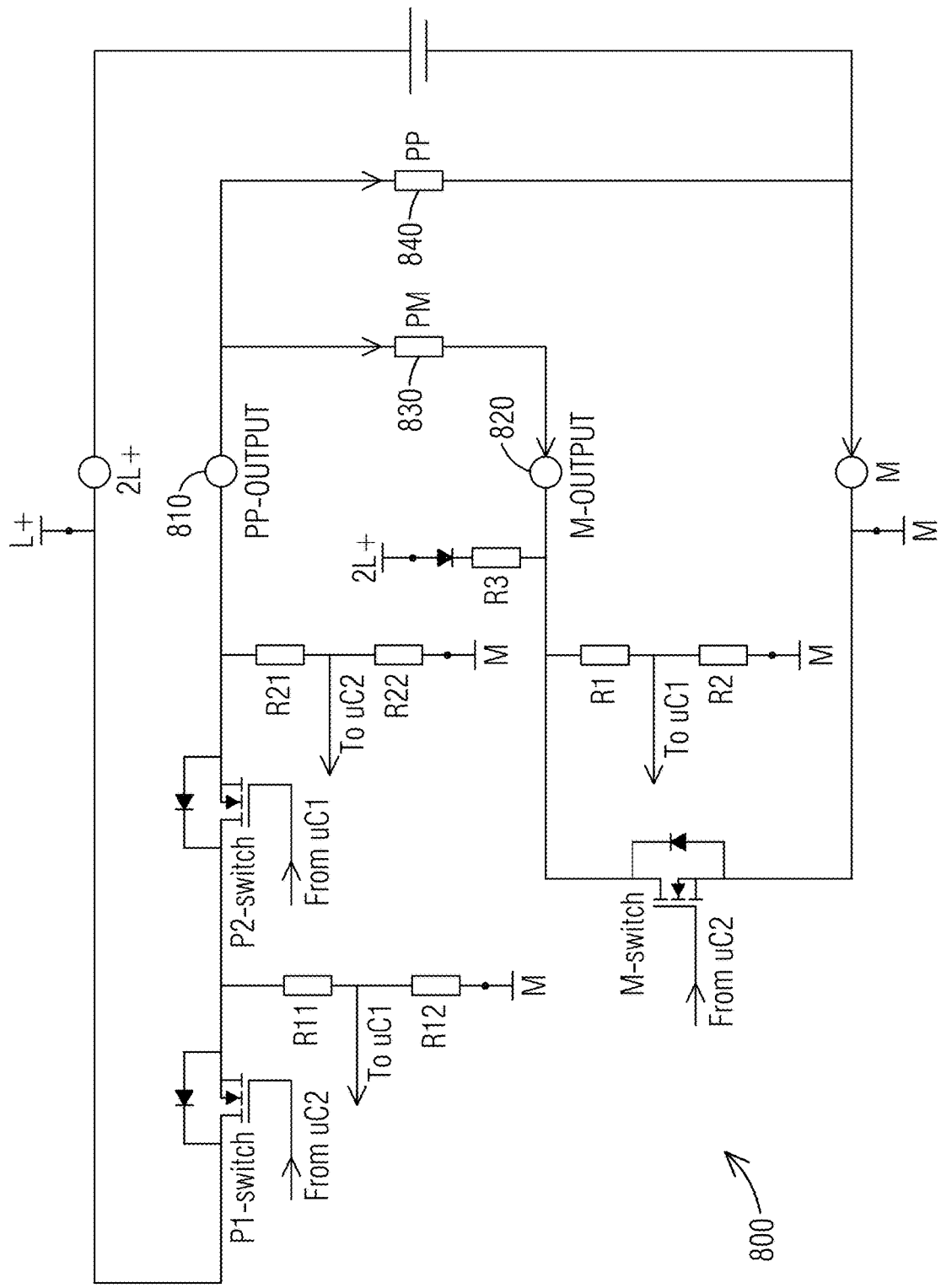
FIG. 8 illustrates a schematic diagram of internal wiring of a module in accordance with an exemplary embodiment of the present disclosure.

FIG. 8 illustrates a schematic diagram of internal wiring 800 of a module in accordance with an exemplary embodiment of the present disclosure.

The internal wiring 800 illustrates the different output operation types P-P type connection 810 and P-M type connection 820 for an output channel. Each output channel employs three separately controlled switching devices that are distinctly operated and diagnosed to achieve the first output type or the second output type.

With reference to the P-M output type 820, load 830 is wired between a power connection (P2-switch) and a ground connection (M-switch) of the digital output module. Internally, the digital P-M channel (connection 820) consists of one P-switch (P2-switch) and one M-switch, connected in parallel. Both switches P-switch and M-switch are closed to energize the load 830 and opened to de-energize the load 830. The P1-switch is assigned to and closed for both output types (P-M and P-P), see for example P1-switch 3 or 5 as illustrated in FIG. 3.

With reference to the P-P output type 810, load 840 is wired between a power connection (P) of the digital output module and an external ground connection (M).

Internally, the digital P-P output channel (connection 810), contains two P-switches, P1-switch, and P2-switch, connected in series. Both switches P1 and P2 are closed to energize the load 840 and opened to de-energize the load 840.

The described module 300 provides selection of P-M style output and P-P style output at a channel granular level, which means that a user or customer can independently choose the output type of each individual output (output channel CH). Internally, each channel employs three separately controlled switches that are distinctly operated and diagnosed to achieve the selected operating type. This provides the necessary independence between output channels. Instead of separate modules, the user or customer can use an individual module and then configure desired output operation at a channel granular level. The described module 300 including different output operation types (P-P or P-M) for each individual digital output channel CH can be configured as a digital output module 300 as described herein or as an input/output (I/O) module. Further, the module 300 can be locally connected to a CPU or remotely connected to a CPU as all or part of a distributed I/O device as described for example with reference to FIG. 2.

The invention claimed is:

1. A module with a digital output, comprising:
a plurality of output channels,
wherein each output channel is configured to transmit digital output signals,
wherein each output channel comprises switching devices and a load is connectable between the switching devices,
wherein each output channel is individually configurable to operate according to a first output type or a second output type,
wherein the first output type comprises a P-M type connection, wherein the load is wired between a power connection (P) and a ground connection (M) of the module, and
wherein the second output type comprises a P-P type connection, wherein the load is wired between the power connection (P) of the module and an external ground connection (M).

2. The module of claim 1,
wherein the P-P type connection includes two P-switching devices connected in series, the two P-switching devices connecting the load to power (P) of the module.

3. The module of claim 2,
wherein the two P-switching devices are closed to energize the load and opened to de-energize the load.

4. The module of claim 1,
wherein the load is wired to ground (M) of an external power supply.

5. The module of claim 1,
wherein each output channel employs three separately controlled switching devices that are distinctly operated and diagnosed to achieve the first output type or the second output type.

6. The module of claim 1,
wherein the module is configured as input/output (I/O) module.

7. The module of claim 1,
wherein the module is configured as fail-safe digital output module, wherein the fail-safe digital output module is configured to transition to a pre-defined safe state when the module is unable to perform intended functions.

8. A control system comprising:
a central processing unit,
an external power supply,
a plurality of input/output (I/O) modules, wherein at least one fail-safe module comprises:
a digital output and a plurality of output channels,
wherein each output channel is configured to transmit digital output signals,
wherein each output channel comprises switching devices and a load is connectable between the switching devices,
wherein each output channel is individually configurable to operate according to a first output type or a second output type,
wherein the first output type comprises a P-M type connection, wherein the load is wired between a power connection (P) and a ground connection (M) of the at least one fail-safe module, and
wherein the second output type comprises P-P type connection, wherein the load is wired between a power connection (P) of the at least one fail-safe module and an external ground connection (M) of the external power supply.

9. The control system of claim 8,
wherein the P-P type connection includes two P-switching devices connected in series, the two P-switching devices connecting the load to power (P) of the at least one fail-safe module.

10. The control system of claim 9,
wherein the two P-switching devices are closed to energize the load and opened to de-energize the load.

11. The control system of claim 8,
wherein each output channel employs three separately controlled switching devices that are distinctly operated and diagnosed to achieve the first output type or the second output type.

* * * * *